United States Patent
Staubly et al.

(10) Patent No.: US 10,990,737 B2
(45) Date of Patent: Apr. 27, 2021

(54) SECURE ONE-WAY NETWORK GATEWAY

(71) Applicant: Owl Cyber Defense Solutions, LLC, Danbury, CT (US)

(72) Inventors: Steven Staubly, Newtown, CT (US); Michael T. Tsao, Yorktown Heights, NY (US); Brian Kane, Trumbull, CT (US)

(73) Assignee: Owl Cyber Defense Solutions, LLC, Danbury, CT (US)

( * ) Notice: Subject to any disclaimer, the term of this patent is extended or adjusted under 35 U.S.C. 154(b) by 0 days.

(21) Appl. No.: 16/854,131

(22) Filed: Apr. 21, 2020

(65) Prior Publication Data

US 2020/0342153 A1 Oct. 29, 2020

Related U.S. Application Data

(60) Provisional application No. 62/837,321, filed on Apr. 23, 2019.

(51) Int. Cl.
| | |
|---|---|
| G06F 30/347 | (2020.01) |
| H04L 12/26 | (2006.01) |
| G05B 19/042 | (2006.01) |
| H04L 12/66 | (2006.01) |

(52) U.S. Cl.
CPC ....... *G06F 30/347* (2020.01); *G05B 19/0423* (2013.01); *H04L 12/66* (2013.01); *H04L 43/028* (2013.01); *G05B 2219/25252* (2013.01)

(58) Field of Classification Search
None
See application file for complete search history.

(56) References Cited

U.S. PATENT DOCUMENTS

| | | | |
|---|---|---|---|
| 5,703,562 A | 12/1997 | Nilsen | |
| 7,394,288 B1* | 7/2008 | Agarwal | G06F 15/17381 326/39 |
| 7,562,162 B2* | 7/2009 | Kreiner | H04L 67/1097 710/11 |
| 7,675,867 B1 | 3/2010 | Mraz et al. | |
| 7,941,526 B1 | 5/2011 | Hope et al. | |
| 7,992,209 B1 | 8/2011 | Menoher et al. | |
| 8,068,415 B2 | 11/2011 | Mraz | |

(Continued)

*Primary Examiner* — Amy Cohen Johnson
*Assistant Examiner* — James H Cho
(74) *Attorney, Agent, or Firm* — Mandelbaum Silfin Economou LLP; John S. Economou

(57) ABSTRACT

A secure one-way network gateway for transmitting data from a source network to a destination network is disclosed. An input circuit is for coupling to a source network and an output circuit is for coupling to an output network. A memory stores configuration data. Either a single field-programmable device or a pair of field-programmable devices coupled via a one-way link are inserted between the input circuit and the output circuit. The configuration data is loaded into the device(s) to program the device(s) to pass data from the input circuit to the output circuit, to optionally filter the data, and to prevent any data from passing from the output circuit to the input circuit. A processor is coupled to only the memory and a separate management interface. The processor receives updated configuration data via the management interface and replaces the configuration data in the memory with the updated configuration memory.

10 Claims, 1 Drawing Sheet

(56) References Cited

U.S. PATENT DOCUMENTS

| | | | |
|---|---|---|---|
| 8,068,504 B2 * | 11/2011 | Brindle | H04L 63/08 |
| | | | 370/401 |
| 8,139,581 B1 | 3/2012 | Mraz et al. | |
| 8,266,689 B2 | 9/2012 | Menoher et al. | |
| 8,352,450 B1 | 1/2013 | Mraz et al. | |
| 8,353,022 B1 | 1/2013 | Menoher et al. | |
| 8,498,206 B2 | 7/2013 | Mraz | |
| 8,516,580 B2 | 8/2013 | Menoher | |
| 8,565,237 B2 | 10/2013 | Mraz et al. | |
| 8,646,094 B2 | 2/2014 | Staubly | |
| 8,732,453 B2 | 5/2014 | Mraz et al. | |
| 8,776,254 B1 * | 7/2014 | Mraz | H04L 63/123 |
| | | | 726/26 |
| 8,831,222 B2 | 9/2014 | Menoher et al. | |
| 8,887,276 B2 | 11/2014 | Mraz et al. | |
| 8,898,227 B1 | 11/2014 | Mraz et al. | |
| 8,938,795 B2 | 1/2015 | Clarke et al. | |
| 8,997,202 B2 | 3/2015 | Curry et al. | |
| 9,065,878 B2 | 6/2015 | Curry et al. | |
| 9,081,520 B2 | 7/2015 | Mraz et al. | |
| 9,088,539 B2 | 7/2015 | Mraz et al. | |
| 9,088,558 B2 | 7/2015 | Curry et al. | |
| 9,094,401 B2 | 7/2015 | Mraz | |
| 9,160,834 B2 | 10/2015 | Yarger et al. | |
| 9,185,465 B2 * | 11/2015 | Yu | H04N 21/6175 |
| 9,282,102 B2 | 3/2016 | Mraz | |
| 9,305,189 B2 | 4/2016 | Mraz et al. | |
| 9,306,953 B2 | 4/2016 | Mraz et al. | |
| 9,311,329 B2 | 4/2016 | Mraz et al. | |
| 9,380,023 B2 | 6/2016 | Mraz et al. | |
| 9,380,064 B2 | 6/2016 | Mraz et al. | |
| 9,436,825 B2 | 9/2016 | Mraz et al. | |
| 9,575,987 B2 | 2/2017 | Mraz et al. | |
| 9,596,245 B2 | 3/2017 | Mraz et al. | |
| 9,641,499 B2 | 5/2017 | Currey et al. | |
| 9,678,921 B2 | 6/2017 | Clarke et al. | |
| 9,680,794 B2 | 6/2017 | Curry et al. | |
| 9,712,543 B2 | 7/2017 | Mraz et al. | |
| 9,736,121 B2 | 8/2017 | Mraz et al. | |
| 9,853,918 B2 | 12/2017 | Mraz et al. | |
| 9,880,869 B2 | 1/2018 | Mraz et al. | |
| 9,894,083 B2 | 2/2018 | Mraz et al. | |
| 2003/0204422 A1 * | 10/2003 | Reich | G06Q 10/10 |
| | | | 705/7.13 |
| 2006/0224887 A1 | 10/2006 | Vesikivi et al. | |
| 2006/0293057 A1 | 12/2006 | Mazerski et al. | |
| 2007/0050106 A1 * | 3/2007 | Chinnadurai | G07C 5/0858 |
| | | | 701/31.4 |
| 2012/0030768 A1 | 2/2012 | Mraz et al. | |
| 2012/0162697 A1 | 6/2012 | Mraz et al. | |
| 2012/0231764 A1 | 9/2012 | Lindteigen et al. | |
| 2012/0304290 A1 | 11/2012 | McPhail | |
| 2012/0317617 A1 | 12/2012 | Hart et al. | |
| 2013/0040607 A1 | 2/2013 | Lindteigen et al. | |
| 2013/0094485 A1 | 4/2013 | Jiang et al. | |
| 2013/0157645 A1 | 6/2013 | Hart et al. | |
| 2013/0254878 A1 | 9/2013 | Mraz et al. | |
| 2013/0303146 A1 | 11/2013 | Van Voorhees et al. | |
| 2014/0020109 A1 | 1/2014 | Mraz et al. | |
| 2014/0089388 A1 | 3/2014 | Curry et al. | |
| 2014/0136657 A1 | 5/2014 | Mraz | |
| 2014/0139737 A1 | 5/2014 | Clarke et al. | |
| 2014/0165182 A1 | 6/2014 | Curry et al. | |
| 2014/0207939 A1 | 7/2014 | Mraz et al. | |
| 2014/0208420 A1 | 7/2014 | Mraz et al. | |
| 2014/0237372 A1 | 8/2014 | Mraz et al. | |
| 2014/0237561 A1 | 8/2014 | Mraz | |
| 2014/0281169 A1 * | 9/2014 | Mehrotra | G06F 12/0866 |
| | | | 711/103 |
| 2014/0304371 A1 | 10/2014 | Mraz et al. | |
| 2014/0337410 A1 | 11/2014 | Mraz et al. | |
| 2015/0020155 A1 | 1/2015 | Curry et al. | |
| 2015/0020194 A1 | 1/2015 | Mraz et al. | |
| 2015/0026792 A1 | 1/2015 | Mraz et al. | |
| 2015/0059395 A1 | 3/2015 | Kim | |
| 2015/0067104 A1 | 3/2015 | Curry et al. | |
| 2015/0278520 A1 | 10/2015 | Mraz et al. | |
| 2015/0370826 A1 | 12/2015 | Mraz et al. | |
| 2016/0269396 A1 | 9/2016 | Ren et al. | |
| 2017/0078429 A1 | 3/2017 | Toussaint et al. | |
| 2017/0293776 A1 | 10/2017 | Bolignano | |
| 2017/0302625 A1 | 10/2017 | Mraz et al. | |
| 2017/0338559 A1 | 11/2017 | Cheikh et al. | |

* cited by examiner

SECURE ONE-WAY NETWORK GATEWAY

FIELD

This disclosure relates to a secure one-way network gateway, and more particularly to a secure one-way network gateway providing data filtering and implemented using one or more field-programmable gate arrays.

BACKGROUND

Many organizations have processing and communication environments which include different networks subject to differing levels of security. Such environments may include a highly secure network used to communicate confidential or secret information, and one or more less secure networks that do not process confidential or secret information. Such highly secure networks may have strict limitations on the type of data that can be imported thereto or exported therefrom. In addition, the data within a highly secure network may be subject to differing security requirements.

In some cases, a one-way network gateway is used to transfer data from a highly secure network (the source network) to a less secure network (the destination network), or vice versa. A one-way network gateway is preferably hardware-based in order to ensure that data may only pass from the source network to the destination network and to prevent data or any signal whatsoever from passing from the destination network to the source network. The one-way network gateway may receive information at the input via a particular protocol, e.g., User Datagram Protocol (UDP). The one-way network gateway may include a filter that filters the files or other data received at the input to prevent any malware or other harmful files from passing to the destination network and/or to ensure that only approved files received at the input on the source network are passed to the output on the destination network. A typical one-way network gateway includes a source-side server coupled to a destination-side server only via a hardware-enforced one-way link. The hardware-enforced one-way link may comprise a fiber optic link, with the fiber coupled only to a transmitter in the source side server at a first end thereof and to a receiver in the destination-side server at a second end thereof. This one-way link architecture ensures that nothing can be transferred from the destination-side server to the source-side server because there is no data path at all in the reverse direction. One drawback of this type of one-way network gateway is that two servers are required, which can be costly.

Field configurable devices, such as field programmable gate arrays (FPGAs), may be substituted for servers in a one-way network gateway to provide a less expensive solution. However, FPGAs are typically configured using data that is supplied to the FPGA device after the FPGA device is installed in a system. For example, the configuration data is typically loaded into the FPGA device from an external memory each time the system is powered on. Because the processing performed by each FPGA device may need to be updated from time to time (e.g., to update filter parameters), external access is required to each such external memory. However, this external access path must be kept completely isolated from the data path to ensure that there is on ability to gain access to any data passing from the source network to the destination network and to ensure that there is no ability to insert malware of any type into the data path via this external access path.

Accordingly, there is a need for a secure one-way network gateway based on field-programmable devices which isolates the data path from the external access path.

The features, functions, and advantages of the present disclosure can be achieved independently in various embodiments of the present disclosure or may be combined in yet other embodiments in which further details can be seen with reference to the following description and drawings.

BRIEF DESCRIPTION OF THE DRAWINGS

The following detailed description, given by way of example and not intended to limit the present disclosure solely thereto, will best be understood in conjunction with the accompanying drawings in which.

DETAILED DESCRIPTION

In the present disclosure, like reference numbers refer to like elements throughout the drawings, which illustrate various exemplary embodiments of the present disclosure.

Figure 1:
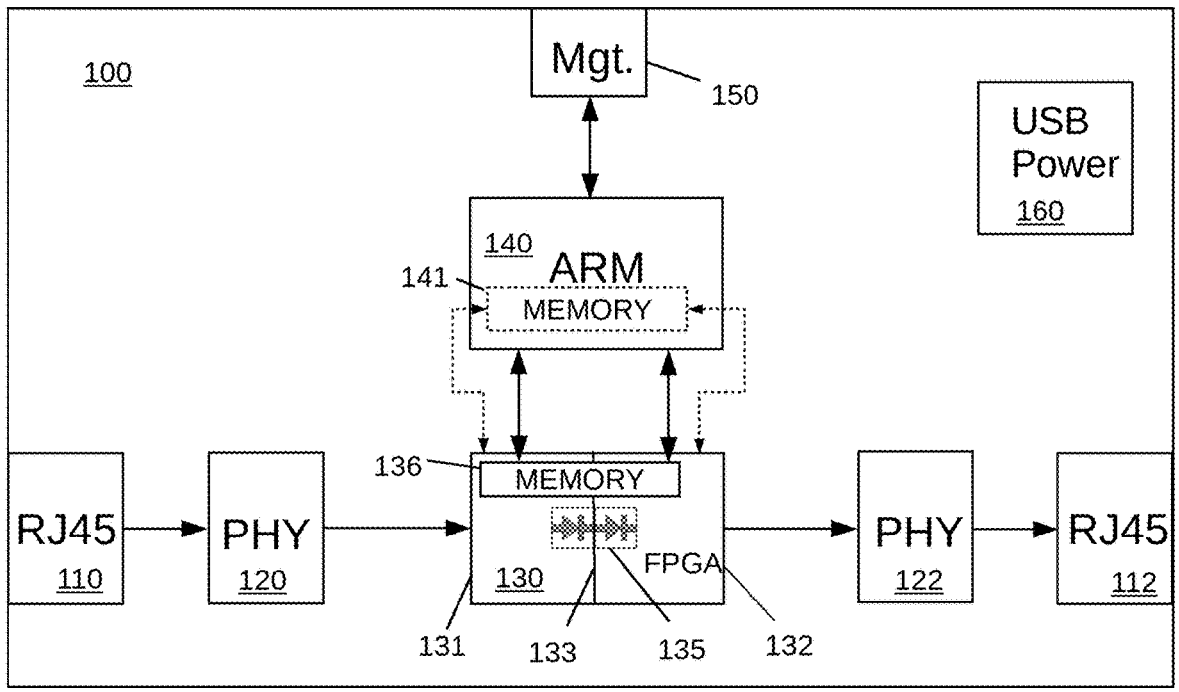
FIG. 1 is a block diagram of a first embodiment of a secure one-way network gateway according to the present disclosure.

Referring now to FIG. 1, a first embodiment of a secure one-way network gateway 100 is shown. Gateway 100 transmits data from a source network coupled to an input (RJ45 interface 110) to a destination network coupled to an output (RJ45 interface 112) while preventing any information whatsoever from passing from the destination network to the source network. Gateway 100 may be powered via a separate USB power interface 160. A first RJ45 interface 110 is provided as an input for connection to source network (not shown). A PHY (physical interface) circuit 120 is coupled to receive input data from RJ45 interface 110. PHY circuit 120 implements the physical layer functions of the OSI model and acts as the input side network interface for gateway 100. PHY circuit 120 is preferably chosen to provide a one Gigabyte Ethernet interface for communication via UDP packets.

A field-programmable device 130, preferably a FPGA, forms a data flow path from an input coupled to first PHY circuit 120 to an output coupled to a second PHY circuit 122. FPGA 130 is coupled to receive data from the output of PHY circuit 120. FPGA 130 is a single-chip solution having red black separation capability, as is known in the art. FPGA 130 has two portions, source side portion 131 and destination side portion 132 separated by a boundary 133. FPGA 130 is configured to implement a one-way link 135 that allows source side portion 131 to pass data to destination side portion 132, but prevents destination side portion 132 from passing any data whatsoever to source side portion. Source side portion 131 is configured to receive data on an input from PHY circuit 120, implement a filter on such data (optionally), and to pass the filtered data via the one-way link 135 to the destination side portion 132. Destination side portion 132 is configured to receive data via the one-way link 135 and to forward the received data on an output to PHY circuit 122. PHY circuit 122 receives data from the output of FPGA 130 and formats it for transmission via a destination side network coupled to RJ45 interface 112.

As explained above, an FPGA is typically configured using data loaded into the FPGA device from memory each time the gateway is powered on. As known in the art, in some designs an external memory is provided to store the FPGA configuration data and in others the FPGA may include an internal memory that stores the FPGA configuration data. In gateway 100, a separate processor 140 (preferably an ARM processor) is provided as a buffer between management interface 150 and FPGA 130. Management interface 150 provides an external link which allows the FPGA configuration data to be updated. This is required, for example, to update the filter parameters used by the filter implemented in source side portion 131 of FPGA 130.

ARM processor 140 may include an internal memory 141 for storing the FPGA configuration data in cases where the FPGA 130 does not include such an internal memory. In this case, a user can connect an external computer to management interface 150 via a conventional (e.g., USB) protocol and transmit an updated FPGA configuration data set to ARM processor 140 for storage in the internal memory 141 of the ARM processor 140. Once the updated FPGA configuration data set is stored in the internal memory 141 of the ARM processor 140, it will be loaded into FPGA 130 upon the next power cycle of gateway 100.

When FPGA 130 includes an internal memory 136 for storing the FPGA configuration data set, ARM processor 140 is configured to receive the updated FPGA configuration set from an external computer via management interface 150 and to forward it for storage in the internal memory 136 of FPGA 130. In a similar manner, FPGA 130 will be updated based on the updated FPGA configuration set upon the next power cycle of gateway 100.

Two connections are shown between ARM processor 140 and FPGA 130 in order to demonstrate that FPGA 130 has two distinct portions (source side portion 131 and destination side portion 132) as discussed above. Management interface 150 is separate from the input RJ45 interface 110 and the output RJ45 interface 112 and can only communicate to ARM processor 140. In this manner, the management interface 150 is completely isolated from the data path formed by FPGA 130 after configuration, ensuring that no malware of any sort can be inserted into the data flow path of FPGA 130 via management interface 150 and that there can be no ability to access any data within the data flow path of FPGA 130 via management interface 150.

Figure 2:
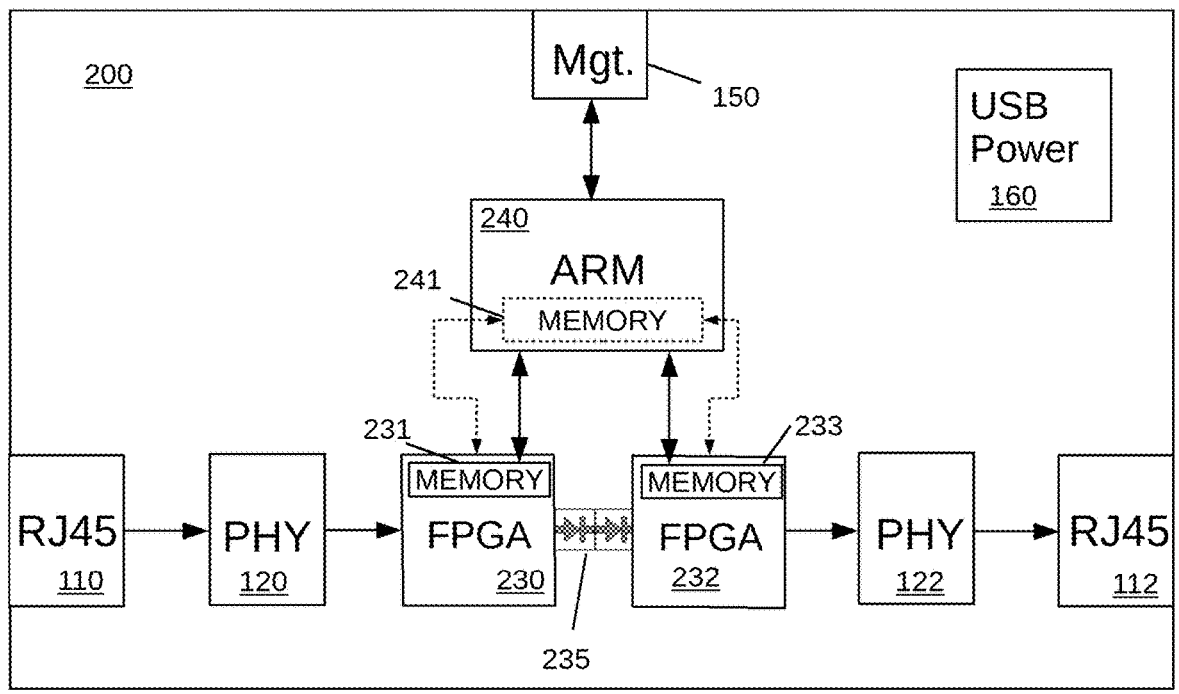
FIG. 2 is a block diagram of a second embodiment of a secure one-way network gateway according to the present disclosure

In a second embodiment of a gateway 200 for providing a secure one-way network gateway shown in FIG. 2, two separate FPGAs 230 and 232 are provided, instead of a single FPGA providing red black separation as in the first embodiment. Gateway 200 transmits data from a source network coupled to an input (RJ45 interface 110) to a destination network coupled to an output (RJ45 interface 112) while preventing any information whatsoever from passing from the destination network to the source network. FPGA 230 provides the functionality provided by source side portion 131 in FIG. 1. FPGA 230 receives data on an input from PHY circuit 120, implements a filter on such data (optionally), and passes the filtered data to an input of FPGA 232 via a one-way link 235. One-way link 235 can be any known type of link that creates a hardware-enforced one-way data path, e.g., an optical isolator. FPGA 232 provides the functionality provided by destination side portion 132 in FIG. 1. FPGA 232 receives data via the one-way link 235 and forward the received data on an output to PHY circuit 122.

In the FIG. 2 embodiment, processor 240 (preferably an ARM processor) operates in a similar manner as ARM processor 140 in FIG. 1, but is required to manage two separate sets of FPGA configuration data, one for FPGA 230 and another for FPGA 232. In particular, ARM processor 240 may include an internal memory 241 for storing the two sets of FPGA configuration data in cases where FPGA 230 and 232 do not include such an internal memory. In this case, a user can connect an external computer to management interface 150 via a conventional (e.g., USB) protocol and transmit updated FPGA configuration data sets to ARM processor 140 for storage in the internal memory 241 of the ARM processor 140. Once the updated FPGA configuration data sets are stored in the internal memory 241 of the ARM processor 140, each such data set will be loaded into the appropriate one of FPGA 230 and FPGA 232 upon the next power cycle of gateway 200.

When FPGA 230 and FPGA 232 each includes an internal memory 231, 233 for storing the associated FPGA configuration data set, ARM processor 240 is configured to receive updated FPGA configuration sets from an external computer via management interface 150 and to forward each updated configuration data set for storage in the internal memory 231, 233 of the appropriate one of FPGA 230 and FPGA 232. In a similar manner, FPGA 230 and FPGA 232 will be updated based on the associated updated FPGA configuration set upon the next power cycle of gateway 200.

As with the first embodiment, gateway 200 provides a secure one-way network gateway in which the management interface 150 is completely isolated from the data flow path formed by FPGA 230, one-way link 235, and FPGA 232 after configuration, ensuring that no malware of any sort can be inserted into that data flow path via management interface 150 and that there can be no ability to access any data within that data flow path via management interface 150.

Although the present invention has been particularly shown and described with reference to the preferred embodiments and various aspects thereof, it will be appreciated by those of ordinary skill in the art that various changes and modifications may be made without departing from the spirit and scope of the invention. It is intended that the appended claims be interpreted as including the embodiments described herein, the alternatives mentioned above, and all equivalents thereto.

What is claimed is:

1. A secure one-way network gateway for transmitting data from a source network to a destination network, comprising:
    an input circuit for coupling to the source network;
    an output circuit for coupling to an output network;
    a memory for storing a first set of configuration data and a second set of configuration data;
    a one-way link having an input and an output, the one-way link passing data from the input to the output and preventing any data from passing from the output to the input;
    a first field-programmable device coupled to the input circuit and to the input of the one-way link, the first field-programmable device configured to load the first set of configuration data from the memory, the first set of configuration data for programming the first field-programmable device to pass data from the input circuit to the input of the one-way link;
    a second field-programmable device coupled to the output of the one-way link and to the output circuit, the second field-programmable device configured to load the second set of configuration data from the memory, the second set of configuration data for programming the second field-programmable device to pass data from the output of the one-way link to the output circuit; and a processor coupled to the memory and a separate management interface, the processor configured to receive an updated first set of configuration data and/or an updated second set of configuration data via the management interface and to replace the respective first set of configuration data and/or second set of configuration data in the memory with the received updated first set of configuration data and/or updated second set of configuration data.

2. The secure one-way network gateway of claim 1, wherein the first field-programmable device is a field programmable gate array.

3. The secure one-way network gateway of claim 1, wherein the second field-programmable device is a field programmable gate array.

4. The secure one-way network gateway of claim 1, wherein the input circuit is a physical interface circuit.

5. The secure one-way network gateway of claim 1, wherein the output circuit is a physical interface circuit.

6. The secure one-way network gateway of claim 1, wherein the first set of configuration data for the first field-programmable device programs the first field-programmable device to filter the data based on filter parameters before passing the filtered data to the input of the one-way link.

7. The secure one-way network gateway of claim 6, wherein the first set of updated configuration data includes updated filter parameters.

8. The secure one-way network gateway of claim 1, wherein the memory has a first portion for storing the first set of configuration data within the first field-programmable device and a second portion for storing the second set of configuration data within the second field-programmable device.

9. The secure one-way network gateway of claim 1, wherein the memory is within the processor.

10. The secure one-way network gateway of claim 1, wherein the processor is an Advanced RISC (Reduced Instruction Set Computer) Machine (ARM) processor.

* * * * *